United States Patent [19]

Takeuchi

[11] Patent Number: 4,551,357
[45] Date of Patent: Nov. 5, 1985

[54] PROCESS OF MANUFACTURING CERAMIC CIRCUIT BOARD

[75] Inventor: Yukihisa Takeuchi, Nagoya, Japan

[73] Assignee: NGK Insulators, Ltd., Japan

[21] Appl. No.: 661,470

[22] Filed: Oct. 16, 1984

[30] Foreign Application Priority Data

May 25, 1984 [JP] Japan ................................. 59-107083

[51] Int. Cl.[4] .......................... B05D 5/12; B05D 3/02
[52] U.S. Cl. .................................... 427/96; 427/376.6
[58] Field of Search ..................... 427/96, 376.3, 376.6

[56] References Cited

U.S. PATENT DOCUMENTS

| | | | |
|---|---|---|---|
| 3,661,615 | 5/1972 | Gray et al. ............................ | 427/96 |
| 4,079,156 | 3/1978 | Youisey et al. ...................... | 427/96 |
| 4,109,377 | 8/1978 | Blazisk et al. ....................... | 427/96 |
| 4,341,820 | 7/1982 | Taylor et al. ..................... | 427/376.6 |
| 4,388,347 | 6/1983 | Shum et al. ........................... | 427/96 |
| 4,409,261 | 10/1983 | Kuo ....................................... | 427/96 |

Primary Examiner—John H. Newsome
Attorney, Agent, or Firm—Parkhurst & Oliff

[57] ABSTRACT

A process of manufacturing a ceramic circuit board, wherein at least dielectric ceramics and a conductor paste of base metal are co-fired, comprising the steps of preparing the conductor paste containing an organic material which is thermally decomposed at a temperature higher than a decomposition point of an organic binder contained in the dielectric ceramics, and forming a circuit pattern of the conductor paste containing the organic material. Alternatively, the process comprises the steps of forming the circuit pattern of the conductor paste and covering the formed circuit pattern with the organic material. The process further comprises the steps of thermally decomposing the organic binder in an oxidizing atmosphere at a temperature lower than the decomposition point of the organic material, and thermally decomposing the organic material in an atmosphere having a partial oxygen pressure lower than that of the oxidizing atmosphere.

30 Claims, No Drawings

PROCESS OF MANUFACTURING CERAMIC CIRCUIT BOARD

BACKGROUND OF THE INVENTION

The present invention relates to a process of manufacturing a ceramic circuit board, wherein at least dielectric ceramics and a conductor paste of base metal are co-fired.

In the art of manufacture of ceramic circuit boards, especially multiple-layered ceramic circuit boards, a method has been known wherein conductor circuit patterns are screen-printed on a dielectric ceramic green body, with a conductor paste which includes, as a major component thereof, at least one noble metal such as gold, silver, platinum and their alloys that are stable in an oxidizing atmosphere. The ceramic green body and the printed conductor circuit patterns of noble metal paste are then co-fired in air, and thus a ceramic circuit board is obtained. An alternative method is known, wherein the conductor circuit patterns are formed of a conductor paste the major component of which is a base metal such as copper, nickel and tungsten, and wherein a non-oxidizing atmosphere is used for firing the ceramic green body and the printed conductor paste.

The former method of manufacturing a ceramic circuit board is advantageous in that the co-firing process may be achieved in air. However, this method can be practiced only at a high cost because of the use of gold, silver and other noble metals that are considerably expensive. Thus, the method suffers a serious problem in terms of manufacturing economy. On the other hand, the latter method which uses base metals as a conductor paste is advantageous in material cost and excellent in electrical properties of the obtained ceramic circuit board, but has some significant drawbacks in quality of the end products, i.e., ceramic circuit boards. Stated more specifically, since the firing operation in this latter method is effected in a non-oxidizing atmosphere, an organic binder which is a component of a dielectric ceramic composition forming an insulation layer of the ceramic circuit board, is not sufficiently decomposed in the non-oxidizing atmosphere, that is, the organic binder is left in the form of carbon, whereby the ceramic circuit board tends to have blackened surfaces, pin holes and blisters, and are liable to suffer insufficient sintering and deterioration of electrical properties.

As stated above, the known dielectric ceramic composition with base metal conductors has problems of low rate of burnout or removal of an organic binder, and low degree of sintering. In view of these problems, it has been considered difficult to industrially practice the method wherein a ceramic circuit board is fabricated by way of co-firing the ceramic dielectric composition including a glass component, together with base metal conductors in a non-oxidizing atmosphere.

Nevertheless, efforts have been made to overcome the above indicated problems associated with the technology of co-firing a dielectric ceramic composition with a conductor of base metal. For example, various ceramic compositions for dielectrics have been proposed, including: a ceramic composition containing crystallizable glass; a ceramic composition containing a relatively large amount of alumina, zirconia or other refractory filler which is mixed with a glass component; a ceramic composition containing an oxide of high valence metal such as $Co_3O_4$; and a ceramic composition containing an organic binder which is thermally decomposable at a low temperature. However, these proposed compositions have not been found satisfactory to eliminate the drawbacks experienced in the prior art.

SUMMARY OF THE INVENTION

It is therefore a primary object of the present invention to provide an improved process of manufacturing a ceramic circuit board wherein at least dielectric ceramics and a conductor paste of base metal are co-fired, which is capable of providing the ceramic circuit board with enhanced characteristics.

Another object of the present invention is the provision of such an improved process which permits protection of base metal conductors of the circuit board against oxidation, and which provides improvements in adhesion of the conductors to the dielectric ceramic layers, in solderability of the conductors, and in electrical properties of the circuit boards, and minimum development of blisters on the boards.

According to the invention, there is provided a process of manufacturing a ceramic circuit board, wherein at least dielectric ceramics and a conductor paste of base metal are co-fired, comprising: a first step of preparing the conductor paste of base metal containing an organic material which is thermally decomposed at a temperature higher than a decomposition point of an organic binder contained in the dielectric ceramics; a second step of forming a circuit pattern of the conductor paste containing the organic material; a third step of thermally decomposing the organic binder in an oxidizing atmosphere at a temperature lower than the decomposition point of the organic material; and a fourth step of thermally decomposing the organic material in an atmosphere having a partial oxygen pressure lower than that of the oxidizing atmosphere used for the thermal decomposition of the organic binder.

According to an alternative aspect of the invention, the first and second steps stated above may be replaced by a step of forming a circuit pattern of the conductor paste of base metal, and a step of covering the formed circuit pattern with said organic material.

In the above described process of the invention for manufacturing a ceramic circuit board, the circuit pattern printed with a base metal conductor paste is protected by an organic material which has a thermal decomposition point higher than that of an organic binder contained in dielectric ceramics forming dielectric or insulating layers of the ceramic circuit board. The organic material which is mixed in the conductor paste or which covers the printed conductor circuit pattern, protects the circuit pattern against oxidation while the organic binder in the dielectric ceramics is thermally decomposed or removed in an oxidizing atmosphere at a temperature lower than the decomposition point of the organic material. In other words, the organic material permits effective decomposition of the organic binder in the dielectric ceramics, thereby considerably reducing an amount of residual carbon in the ceramic circuit board. Therefore, the development of blisters in a subsequent step of co-firing the dielectric ceramics and the conductor paste (circuit pattern) is effectively reduced. Further, the covering of the base metal conductor with the organic material, or a reducing action of the organic material during thermal decomposition thereof, serves to keep the base metal conductor in a metallic state, and effectively prevent the oxidation of the conductor, thereby improving its solderability, and adhesion to the dielectric or insulating layers. Further, the organic material added to the conductor paste prevents denaturation of a glass component of the dielectric ceramics forming the insulating layers of the ceramic circuit board. This prevention of denaturation of the glass component, together with the above indicated reduction in the amount of residual carbon, will lead to improvements in insulation resistance, dielectric constant, dielectric dissipation factor (loss tangent; tan $\delta$), and other electrical properties of the produced circuit board.

DETAILED DESCRIPTION OF THE PREFERRED EMBODIMENTS

Like dielectric ceramics known in the prior art, the dielectric ceramics used according to the invention to form a ceramic circuit board comprises as major components thereof an electrically insulating glass and an organic binder. The insulating glass is preferably of the nature which has a high degree of sintering. More specifically, it is preferred to use: various kinds of silicate glass; such silicate glass which includes at least one on $Al_2O_3$, $B_2O_3$, MgO, PbO, BaO, ZnO, $Li_2O$, $Ti_2O$, CaO and $ZrO_2$; or crystallizable glass which is crystallized through heat treatment thereof. One preferred composition of such crystallizable insulating glass consists essentially of $SiO_2$, $Al_2O_3$, CaO, ZnO and $TiO_2$. Another preferred composition of the glass consists essentially of $SiO_2$, MgO, BaO, $B_2O_3$ and ZnO. A further preferred composition of the glass consists essentially of $SiO_2$, $Al_2O_3$, PbO and CaO. A still further preferred composition of the glass consists essentially of $SiO_2$, $Al_2O_3$, CaO, $B_2O_3$ and MgO. A yet another preferred composition of the glass consists essentially of $SiO_2$, $B_2O_3$, PbO and CaO. In general, glasses are liable to be denatured in a reducing atmosphere. In the process of the invention wherein the organic binder is decomposed in an oxidizing atmosphere, however, such insulating glass in the dielectric ceramics is protected against denaturation. This means that the particular kind of atmosphere in which the organic binder is decomposed, does not limit the composition of the insulating glass of the dielectric ceramics used in the instant process.

As the organic binder which is a component of the dielectric ceramics, any binders commonly included in the known dielectric compositions may be used. However, polymeric binders comprising at least one of the following as major components thereof are suitably used: acrylic resins; methacrylic resins; and acrylate-methacrylate copolymer. The amount of the organic binder to be included in the dielectric ceramics is generally within a range of 3% to 20% by weight. The dielectric ceramic includes insulating glass in an amount of 5–90% by weight, preferably 20–80% by weight.

The dielectric ceramics used according to the invention, which includes as major components thereof the aforementioned insulating glass and organic binder, may further include a filler of refractory material such as alumina, zirconia, silica, mullite and cordierite alone or in combination, and/or an additive of an oxide such as cobalt oxide, zinc oxide, praseodymium oxide and bismuth oxide, alone or in combination. The amount or amounts of the refractory filler and/or the oxide additive is (are) determined so as to attain an intended degree of sintering of the dielectric ceramics. In normal conditions, the proportion of the insulating glass to the refractory filler and/or the oxide additive is held within a range of about 90/10 to 5/95. Further, it is preferred to add 0.1–40% by weight of peroxide, such as strontium peroxide, calcium peroxide and other inorganic peroxides to the dielectric ceramics, in order to facilitate removal of the organic binder.

The dielectric ceramics having a composition which has been described, is used as dielectric ceramic pastes for screen printing, or as green sheet materials. When the dielectric ceramics is used as a dielectric ceramic printing paste, a suitable vehicle such as acetone, terpineol, methyl carbitol and butyl carbitol acetate is further added to the dielectric ceramics. In the case where the dielectric ceramics is used as a material for green sheets, a slip or slurry is prepared by adding to the dielectric ceramics at least one suitable known solvent such as trichloroethylene, toluene-ethyl acetate, xylene, acetone, alcohol and benzene, and if necessary, at least one suitable known plasticizer such as dibutyl phthalate, and a suitable deflocculant such as menhaden oil or trioleic acid glyceryl ester. Subsequently, the prepared slurry is cast into a ceramic green sheet in a conventional doctor-blading process.

The conductor paste of base metal used to form a conductor which is co-fired with the dielectric ceramics into a ceramic circuit board, comprises as major components thereof at least one of Cu, Ni, Cr, W, Mo, and other base metals, and further comprises, as needed, a glass component, and suitable organic binder and vehicle, known in the prior art. In the present invention, however, Cu and Ni are particularly suitably used.

In preparing the conductor paste, the base metal in the form of particles is used in an amount of 50–95% by weight, preferably 70–95% by weight, the glass component in an amount of 0.1–20% by weight, preferably 1–10% by weight, and the organic binder in an amount of 1–30% by weight. The amount of the vehicle is selected within a range of 1–40% by weight so that the conductor paste is given an intended viscosity. The above values in weight percent are given so that all components including the vehicle amount to 100% in total.

The present invention is applicable to the fabrication of a multilayer ceramic circuit board, as well as a single-layer ceramic circuit board, using the aforementioned dielectric ceramics and base metal conductor paste, according to known methods of forming a multilayer structure, such as "green sheet lamination technology", "printed lamination technology" and "thick film multilayer technology". Stated in more detail, a circuit pattern formed of a base metal conductor paste is protected by a specific organic material, as previously indicated. The organic material used according to the invention is of the nature which is thermally decomposed at a temperature higher than a decomposition point of an organic binder contained in the dielectric ceramics. Particularly, resins are preferred as the organic material. For example, at least one of polystyrene resins, polyethylene resins and ethylene-vinyl acetate copolymers is suitably used. The organic material selected to protect the conductor paste of base metal is either mixed in the conductor paste, or coated over the circuit pattern which has been formed of the conductor paste.

In the case where the organic material is mixed in the base metal conductor paste, the organic material is added, generally in solution, to the conductor paste, and the organic material solution is mixed with the conductor paste to provide a homogeneous mixture of the conductor paste and organic material. The organic material is generally 1-30%, preferably around 2-7%, by weight of the mixture. In the case where the organic material is applied so as to cover the circuit pattern printed with the base metal paste, the material is normally used in the form of a solution, i.e., dissolved in a suitable solvent so that the solution has a 0.1-20%, preferably 1-3% concentration of the organic material.

As stated above, the organic material selected and prepared according to the invention serves to protect the printed circuit pattern of the base conductor paste. Described more specifically, the dielectric ceramics and the conductor paste of base metal are used to print a desired number of layers of dielectrics and conductors (insulating and conductor pattern layers) one on another alternately according to a normally practiced method so-called "printed lamination technology" or "thick film multilayer technology". Alternatively, the conductor paste is applied to a green sheet made of the dielectric ceramics to form a printed circuit pattern on the dielectric green sheet. A desired number of the printed green sheets are stacked and laminated at an elevated temperature under a suitable pressure. Thus, an unfired multilayer structure of a ceramic circuit board is prepared. In either one of the above two processes, the organic material is premixed in the conductor paste of base metal before the paste is applied to form a printed conductor circuit pattern, or alternatively, a coating of the organic material is applied to cover at least the conductor circuit pattern which has been already printed with the conductor paste.

The thus prepared unfired ceramic circuit board having the printed circuit pattern of the conductor paste protected by the organic material, is placed in an oxidizing atmosphere at a temperature lower than the decomposition point of the organic material, for the purpose of thermally decomposing and removing the organic binder which is contained in the dielectric ceramics.

During heating in the oxidizing atmosphere, oxygen is supplied to the dielectric ceramic layers of the multilayer structure, whereby the carbon produced as a result of thermal decomposition of the organic binder in the dielectric ceramic layers is effectively removed, and consequently the development of blisters in the following firing step is effectively restrained. Further, the supply of oxygen from the oxidizing atmosphere serves to relax the reducing condition resulting from burning of the organic binder. This effect combines with the above described carbon removing effect of the oxygen to protect the glass component of the dielectric layer against denaturation or change in properties, and to improve the degree of sintering of the glass component, thereby contributing to improvement in electrical properties of the dielectric layers.

While the organic binder in the dielectric layers of the unfired multilayer circuit board is removed in the oxidizing atmosphere, the circuit pattern made of the conductor paste is protected by the organic material as previously described, and therefore its oxidation by the oxidizing atmosphere is effectively prevented. In this connection, it is noted that the oxidizing atmosphere is an atmosphere which permits efficient thermal decomposition of the organic binder in the dielectric layers, without giving an adverse effect on the conductor circuit pattern protected by the organic material. The oxygen concentration of the oxidizing atmosphere to be used according to the invention depends upon the kind and particle size of the specific base metal used for the conductor paste. For example, when the conductor paste used is a Cu paste of copper powder of 2 $\mu$m average particle size including an organic material according to the invention, it is preferred to use a nitrogen atmosphere containing about 100-10000 ppm of oxygen. When the conductor paste comprises a Ni paste of 2 $\mu$m average particle size including an organic material according to the invention, a nitrogen atmosphere containing not less than 1000 ppm of oxygen is suitably used.

After the organic binder contained in the dielectric ceramic layers has been thermally decomposed and removed in the manner as described above, the unfired structure of ceramic circuit board is further subjected to a heat treatment at a temperature not lower than the decomposition point of the organic material, which point is higher than the temperature at which the organic binder is thermally decomposable. In this heat treatment, the organic material protecting the conductor paste is thermally decomposed and removed. This heat treatment step to remove the organic material is generally followed by a firing step, that is, a step of co-firing the dielectric ceramic layers (insulating layers) and the printed conductor circuit patterns (conductor pattern or metallizing layers) formed of the base metal paste.

As a result of the removal of the organic material which has protected the circuit patterns, and the subsequent co-firing of the multilayer circuit board structure, the circuit pattern is eventually formed of a conductor of the selected base metal which is subjected to substantially no oxidation and therefore remains in a metallic state. This formation of the base metal conductor in a metallic state is considered to be realized thanks not only to the protection by the selected organic material, but also to a reducing action upon thermal decomposition of the organic material.

The decomposing and co-firing atmosphere used to thermally decompose organic material, and to co-fire the dielectric layers and the base metal conductor circuit pattern layers, is required to have a partial oxygen pressure lower than that of the oxidizing atmosphere used to thermally decompose the organic binder, so that the base metal conductors are not adversely influenced or affected. While the partial oxygen pressure depends upon the kind and particle size of the base metal used, a nitrogen atmosphere, or a nitrogen atmosphere containing a slight amount of oxygen is preferred for removal of the organic material and co-firing of the dielectric-conductor structure. For example, it is preferred to use a nitrogen atmosphere containing not more than 100 ppm of oxygen when the previously indicated Cu paste is used, or a nitrogen atmosphere containing not more than 1000 ppm of oxygen when the previously indicated Ni paste is used. Further, a mixture gas of nitrogen and hydrogen, or a $H_2 + N_2 + H_2O$ gas (mixture of nitrogen and hydrogen gases and water vapor) may also be used as a decomposing and co-firing atmosphere having a reduced partial oxygen pressure as compared with the oxidizing atmosphere for thermal decomposition of the organic binder. It is noted that the decomposing and co-firing atmosphere need not be held constant in nature throughout the thermal decomposition of the protective organic material and the co-firing operation. For example, the decomposing and co-firing atmosphere may be changed in concentration of its components due to variation in temperature.

To further illustrate the present invention, the following examples are given; however, it is to be understood that these examples are not construed to limit the scope of the invention. Unless otherwise stated, quantities appearing in the examples are expressed as percent by weight.

EXAMPLE 1

A normally used thick film copper paste was prepared from 85% of Cu powder, 3% of glass frit comprising as major components thereof PbO, $B_2O_3$, $SiO_2$ and CdO, 2% of a binder consisting esstentially of methacrylic acid ester, and 10% of a terpineol vehicle. In the meantime, an EVA solution was prepared by dissolving an organic material of ethylene-vinyl acetate copolymer (hereinafter referred to as EVA; thermally decomposed at 450° C.) in a vehicle of toluene. The copper paste and the EVA solution were mixed so that the EVA is present in an amout of 5% of the solid amount of the copper paste. Then, toluene was removed to obtain an EVA-Cu paste.

Subsequently, five green sheets were prepared from dielectric ceramics which consists of: 40% of crystallizable glass consisting of 10% of PbO, 25% of $B_2O_3$, 35% of $SiO_2$, 6% of MgO, 12% of CaO, 6% of $ZrO_2$, 4% of $TiO_2$ and 2% of BaO; 50% of alumina; and 10% of acrylic binder as an organic binder. By using the above EVA-Cu paste, a desired circuit pattern was printed on a predetermined portion of each of the prepared green sheets.

The five green sheets each with the printed circuit pattern layer were laminated, and placed in a nitrogen atmosphere containing 500 ppm of oxygen. The temperature of the nitrogen atmosphere was elevated from the room temperature to 400° C., and the laminated green sheet structure was held at 400° C. for one hour, whereby the organic binder (acrylic binder) was removed through oxidation and thermal decomposition. Subsequently, the laminated green sheet structure having the five conductor pattern layers was placed in a nitrogen atmosphere containing not more than 30 ppm of oxygen, at 500° C. for one hour. Then, the nitrogen atmosphere was elevated to 950° C. to thermally decompose the EVA and co-fire the Cu paste pattern layers and the laminated dielectric green sheets. Thus, an intended ceramic circuit board was produced as Sample No. 1.

To prepare comparative ceramic circuit boards as Samples Nos. 2 and 3, a thick film copper paste which does not contain EVA (organic material for protecting the copper paste) was prepared. This copper paste was used to print a circuit pattern on the same green sheets as used for Sample No. 1. The green sheets with the printed circuit patterns were laminated and co-fired in the same manner as used for Sample No. 1, and the ceramic circuit board of Sample No. 2 was obtained. The ceramic circuit board of Sample No. 3 was obtained by firing the laminated printed green sheets in a decomposing and co-firing atmosphere of not higher than 30 ppm oxygen concentration, such that the atmosphere was heated from the room temperature up to 900° C. according to the same heating schedule as used for Sample No. 1.

The thus prepared Samples Nos. 1–3 were tested and evaluated in various characteristics. The test results are listed in Table 1. In the measurements of Table 1, an insulation resistance is a result obtained at DC 100 V, and a dielectric constant and a dielectric dissipation factor (tan δ) are measurements at 1 MHz. The form of the copper conductor was examined through identification by an X-ray photo-electron spectroscopy.

As is apparent from comparing the instant ceramic circuit board of Sample No. 1 with those of comparative Samples Nos. 2 and 3, the instant ceramic circuit board is improved in characteristics over the comparative examples, for example in terms of the form of the copper conductor, development of blisters, adhesion of the conductor to the dielectric layers, solderability of the conductor, amount of residual carbon, and properties of the dielectric structure.

TABLE 1

| | Example No. | | |
|---|---|---|---|
| | 1 | 2 | 3 |
| Form of Cu Conductor | Metal | Oxide | Metal |
| Development of Blisters | None | None | Yes |
| Adhesion of Cu Conductor | Excellent | Partly peeled off | Poor |
| Solderability of Cu Conductor (2 sec.) | 100% | <1% | 90% |
| Sheet Resistance (mΩ/□) | 2.5 | >$10^4$ | 2.5 |
| Insulation Resistance (Ωcm) | >$10^{15}$ | >$10^{15}$ | $2.0 \times 10^9$ |
| Dielectric Constant | 4.3 | 5.2 | 7.7 |
| tan δ (%) | <0.1 | <0.3 | 0.6 |
| Amount of Residual Carbon | 0.01 | 0.01 | 0.4 |

EXAMPLE 2

A conductor circuit pattern was printed, with an ordinary thick film copper paste, on the green sheet of Example 1. The green sheet with the printed circuit pattern was dried into an unfired ceramic circuit board with a single conductor pattern layer.

In the meantime, EVA was dissolved in toluene, so that a 2% solution of EVA was obtained. This EVA solution was applied to the unfired ceramic circuit board such that at least the printed Cu conductor circuit pattern is coated or covered with the EVA, or such that the printed conductor circuit pattern contains or absorbs the EVA.

The unfired ceramic circuit board with the EVA applied to the conductor circuit pattern was placed in a nitrogen atmosphere containing 400 ppm of oxygen. The atmosphere were heated from the room temperature up to 400° C., during which the organic binder (acrylic resin) contained in the dielectric ceramic green sheet was removed through oxidation and thermal decomposition. Then, the unfired circuit board was put into a nitrogen atmosphere of not higher than 30 ppm oxygen concentration. The atmosphere was heated to 900° C. The EVA (organic material) applied to the printed conductor circuit pattern was thermally decomposed while the dielectric ceramic green sheet and the copper conductor pattern layer (copper paste) were co-fired, whereby the intended single-conductor-layer ceramic circuit board was obtained as Sample No. 4.

To prepare comparative ceramic circuit boards as Samples Nos. 5 and 6, the same green sheet as used for Sample No. 4 was provided with a printed copper conductor circuit pattern which is not coated with or does not contain the EVA. The ceramic circuit board of Sample No. 5 was prepared in a firing process using the same atmospheres and the same heat control procedure as used for Sample No. 4. The ceramic circuit board of Sample No. 6 was prepared by firing the printed green sheet in an atmosphere of not higher than 30 ppm oxygen concentration, such that the atmosphere was heated from the room temperature up to 900° C.

The ceramic circuit boards of Samples Nos. 4–6 were tested and evaluated in various characteristics. The ceramic circuit board of Sample No. 4 according to the invention had the copper conductor in the form of metal rather than oxide, had no blisters, and demonstrated excellent adhesion of the copper conductor to the dielectric layer, excellent solderability of the copper conductor, and excellent electrical properties, i.e., sheet resistance of 2.5 m$\Omega$/□ and insulation resistance of not less than $10^{15}$ $\Omega$cm. Further, Sample No. 4 showed a small amount of residual carbon, i.e., not more than 0.01%.

On the contrary, the comparative ceramic circuit board of Sample No. 5 had the copper conductor in the form of oxide, and this oxide copper conductor was partly peeled off the dielectric layer, and demonstrated poor solderability of the conductor layer. The sheet resistance of Sample No. 5 was more than $10^4$ m$\Omega$/□. The comparative example of Sample No. 6 suffered an appreciable degree of development of blisters, and had an insulation resistance of $1.7 \times 10^9$ $\Omega$cm and a carbon residue in an extremely large amount of 0.3%.

EXAMPLE 3

A dielectric ceramic paste for printing dielectric layers (insulating layers) was prepared by evenly admixing 23 parts by weight of terpineol (as an organic vehicle), with 77 parts by weight of dielectric ceramics consisting of: 75% of crystallizable glass consisting of 30% of $SiO_2$, 13% of $Al_2O_3$, 20% of CaO, 21% of ZnO, 12% of $TiO_2$ and 4% of $B_2O_3$; 20% of alumina as a filler; and 5% of acrylate-methacrylate copolymer resin as an organic binder; and terpineol as an organic vehicle. In the meantime, an ordinary thick film nickel conductor paste for printing conductor pattern layers (metallizing layers), and the same EVA solution as used in Example 2, were prepared. The nickel conductor paste was prepared from 67% of Ni powder, 5% of glass frit comprising as major components thereof $SiO_2$, $B_2O_3$, $Al_2O_3$ and PbO, 4% of a binder consisting essentially of ethyl cellulose, and 24% of a terpineol vehicle. Using the prepared dielectric ceramic paste and nickel conductor paste, dielectric and conductor pattern layers were alternately formed by screen-printing on an alumina ceramic substrate plate. The printed dielectric and conductor pattern layers were dried after each of the layers was printed. Thus, an unfired printed structure of ceramic circuit board with three conductor pattern layers was produced. The EVA solution was applied to conductor pattern so as to coat the nickel conductor circuit pattern with the EVA. The thus prepared unfired multilayer ceramic circuit board with the nickel conductor patterns coated with the EVA, was fired in the same procedure as used in Example 2, and a multilayer ceramic circuit board with three conductor pattern layers was obtained as Sample No. 7. In the fabrication of Sample No. 7, the unfired structure was first heat-treated in air by heating from the room temperature up to 250° C., to oxidize and decompose the organic binder (acrylate-methacrylate copolymer resin). Then, the unfired structure was placed in a nitrogen atmosphere of not higher than 300 ppm oxygen concentration, and heated up to 950° C. For comparative purpose, a ceramic circuit board of Sample No. 8 was prepared by effecting the same heat treatment on an unfired three-conductor-layer structure which was not treated with the EVA solution.

The ceramic circuit board of Sample No. 7 was not subject to oxidation of the nickel conductor, that is, the nickel conductor layers are present in the form of metal. Further, Sample No. 7 exhibited good adhesion of the nickel conductor layers to the dielectric layers, high solderability of the nickel conductor layers, and showed a sheet resistance of 34 m$\Omega$/□. On the contrary, the nickel conductor of Sample No. 8 was oxidized, and exhibited poor adhesion and solderability, and a comparatively higher sheet resistance of $10^4$ m$\Omega$/□.

EXAMPLE 4

A polystyrene resin as an organic material (thermal decomposition point: 400° C.) was dissolved in a vehicle of toluene, to prepare a polystyrene solution. An unfired three-conductor-layer structure of ceramic circuit board was prepared in the same manner as used in Example 3, except that an ordinary thick film copper paste was used in place of the thick film nickel paste, and the above polystyrene solution was used in place of the EVA solution.

The unfired structure of ceramic circuit board with the polystyrene solution applied to the copper circuit pattern layers was placed in a nitrogen atmosphere containing 310 ppm of oxygen, and heated from the room temperature up to 370° C., whereby the organic binder (acrylate-methacrylate copolymer resin) in the dielectric layers was removed through oxidation and decomposition. Then, the structure was held at 500° C. for two hours in an atmosphere of not higher than 30 ppm oxygen concentration. During this heat treatment, the polystyrene resin as the organic material was thermally decomposed. Subsequently, the atmosphere was heated to 900° C. to co-fire the dielectric ceramic paste (dielectric layers) and the copper paste (printed conductor circuit pattern) layers. Thus, a ceramic circuit board of Sample. No. 9 was obtained.

The thus prepared ceramic circuit board of Sample No. 9 had the copper conductor layers in the form of metal, had no blisters, and exhibited excellent adhesion and solderability of the copper conductor layers. Further, the circuit board of Sample No. 9 showed a sheet resistance of 2.5 m$\Omega$/□, insulating resistance of higher than $10^{15}$ $\Omega$cm, and residual carbon in an extremely small amount of not more than 0.01%.

What is claimed is:

1. A process for manufacturing a ceramic circuit board, wherein at least dielectric ceramics and a conductor paste of base metal are co-fired, comprising the steps of:

preparing said conductor paste of base metal containing an organic material which is thermally decomposed at a temperature higher than a decomposition point of an organic binder contained in said dielectric ceramics;

forming a circuit pattern of said conductor paste containing said organic material;

thermally decomposing said organic binder in an oxidizing atmosphere at a temperature lower than said decomposition point of said organic material; and thermally decomposing said organic material in an atmosphere having a partial oxygen pressure lower than that of said oxidizing atmosphere.

2. A process as claimed in claim 1, wherein said conductor paste of base metal comprises copper and/or nickel as a major component or major components thereof.

3. A process as claimed in claim 1, wherein said organic binder contained in said dielectric ceramics comprises at least one of organic binders selected from the group consisting of acrylic resins, methacrylic resins, and acrylate-methacrylate copolyer resins, and said organic material contained in said conductor paste comprises at least one of organic materials selected from the group consisting of polystyrene resins, polyethylene resins and ethylene-vinyl acetate copolymers.

4. A process as claimed in claim 2, wherein said organic binder contained in said dielectric ceramics comprises at least one of organic binders selected from the group consisting of acrylic resins, methacrylic resins, and acrylate-methacrylate copolymer resins, and said organic material contained in said conductor paste comprises at least one of organic materials selected from the group consisting of polystyrene resins, polyethylene resins and ethylene-vinyl acetate copolymers.

5. A process as claimed in claim 1, wherein said circuit pattern is printed on a green sheet of said dielectric ceramics, with said conductor paste containing said organic material.

6. A process as claimed in claim 5, wherein said circuit pattern is printed on a plurality of green sheets of said dielectric ceramics, and the green sheets with the printed circuit patterns are laminated to form an unfired laminated sheet structure which is subsequently co-fired into said ceramic circuit board.

7. A process as claimed in claim 1, wherein a dielectric paste is prepared from said dielectric ceramics, and said dielectric paste and said conductor paste are used to print at least one dielectric layer in a predetermined pattern, and at least one conductor layer in the form of said circuit pattern, respectively, said at least one dielectric layer and said at least one conductor layer being alternately superposed one on another to form an unfired printed laminate structure.

8. A process as claimed in claim 1, said dielectric ceramics include at least one insulating glass selected from the group consisting of silicate glass, and crystallizable glass which is crystallized through heat treatment thereof.

9. A process as claimed in claim 8, wherein said silicate glass includes at least one of $Al_2O_3$, $B_2O_3$, $MgO$, $PbO$, $BaO$, $ZnO$, $Li_2O$, $CaO$ and $ZrO_2$.

10. A process as claimed in claim 8, wherein said crystallizable glass is selected from the group consisting of: glass composition consisting essentially of $SiO_2$, $Al_2O_3$, $CaO$, $ZnO$ and $TiO_2$; glass composition consisting essentially of $SiO_2$, $MgO$, $BaO$, $B_2O_3$ and $ZnO$; glass composition consisting essentially of $SiO_2$, $Al_2O_3$, $PbO$ and $CaO$; glass composition consisting essentially of $SiO_2$, $Al_2O_3$, $CaO$, $B_2O_3$ and $MgO$; and glass composition consisting essentially of $SiO_2$, $B_2O_3$, $PbO$ and $CaO$.

11. A process as claimed in claim 1, wherein said organic material is contained in said conductor paste in an amount of 1-30% by weight.

12. A process as claimed in claim 11, wherein said organic material is contained in said conductor paste in an amount of 2-7% by weight.

13. A process as claimed in claim 1, wherein said organic material is applied in the form of a solution to prepare the conductor paste containing the organic material.

14. A process as claimed in claim 1, wherein said dielectric ceramics includes at least one inorganic peroxide.

15. A process as claimed in claim 14, wherein said peroxide is strontium peroxide.

16. A process of manufacturing a ceramic circuit board, werein at least dielectric ceramics and a conductor paste of base metal are co-fired, comprising the steps of:

forming a circuit pattern of said conductor paste of base metal;

covering the formed circuit pattern with an organic material which is thermally decomposed at a temperature higher than a decomposition point of an organic binder contained in said dielectric ceramics;

thermally decomposing said organic binder in an oxidizing atmosphere at a temperature lower than said decomposition point of said organic material; and thermally decomposing said organic material in an atmosphere having a partial oxygen pressure lower than that of said oxidizing atmosphere.

17. A process as claimed in claim 16, wherein said organic material is applied in the form of a solution to cover said circuit pattern.

18. A process as claimed in claim 16, wherein said conductor paste of base metal comprises copper and/or nickel as a major component or major components thereof.

19. A process as claimed in claim 16, wherein said organic binder contained in said dielectric ceramics comprises at least one of organic binders selected from the group consisting of acrylic resins, methacrylic resins, and acrylate-methacrylate copolymer resins, and said organic material contained in said conductor paste comprises at least one of organic materials selected from the group consisting of polystyrene resins, polyethylene resins and ethylene-vinyl acetate copolymers.

20. A process as claimed in claim 17, wherein said organic binder contained in said dielectric ceramics comprises at least one of organic binders selected from the group consisting of acrylic resins, methacrylic resins, and acrylate-methacrylate copolyer resins, and said organic material contained in said conductor paste comprises at least one of organic materials selected from the group consisting of polystyrene resins, polyethylene resins and ethylene-vinyl acetate copolymers.

21. A process as claimed in claim 16, wherein said circuit pattern is printed on a green sheet of said dielectric ceramics, with said conductor paste containing said organic material.

22. A process as claimed in claim 21, wherein said circuit pattern is printed on a plurality of green sheets, and the green sheets with the printed circuit patterns are laminated to form an unfired laminated sheet structure which is subsequently co-fired into said ceramic circuit board.

23. A process as claimed in claim 16, wherein a dielectric paste is prepared from said dielectric ceramics, and said dielectric paste and said conductor paste are used to print at least one dielectric layer in a predetermined pattern, and at least one conductor layer in the form of said circuit pattern, respectively, said at least one dielectric layer and said at least one conductor layer being alternately superposed one on another to form an unfired printed laminate structure.

24. A process as claimed in claim 16, said dielectric ceramics include at least one insulating glass selected from the group consisting of silicate glass, and crystallizable glass which is crystallized through heat treatment thereof.

25. A process as claimed in claim 24, wherein said silicate glass includes at least one of $Al_2O_3$, $B_2O_3$, MgO, PbO, BaO, ZnO, $Li_2O$, CaO and $ZrO_2$.

26. A process as claimed in claim 24, wherein said crystallizable glass is selected from the group consisting of: glass composition consisting essentially of $SiO_2$, $Al_2O_3$, CaO, ZnO and $TiO_2$; glass composition consisting essentially of $SiO_2$, MgO, BaO, $B_2O_3$ and ZnO; glass composition consisting essentially of $SiO_2$, $Al_2O_3$, PbO and CaO; glass composition consisting essentially of $SiO_2$, $Al_2O_3$, CaO, $B_2O_3$ and MgO; and glass composition consisting essentially of $SiO_2$, $B_2O_3$, PbO and CaO.

27. A process as claimed in claim 16, wherein said organic material is contained in said solution in an amount of 1–30% by weight.

28. A process as claimed in claim 27, wherein said organic material is contained in said solution in an amount of 2–7% by weight.

29. A process as claimed in claim 16, wherein said dielectric ceramics includes at least one inorganic peroxide.

30. A process as claimed in claim 27, wherein said peroxide is strontium peroxide.

* * * * *